(12) United States Patent
Suehira et al.

(10) Patent No.: US 8,047,828 B2
(45) Date of Patent: Nov. 1, 2011

(54) IMPRINT APPARATUS, IMPRINT METHOD, AND MOLD FOR IMPRINT

(75) Inventors: Nobuhito Suehira, Kawasaki (JP); Junichi Seki, Yokohama (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 95 days.

(21) Appl. No.: 11/719,434

(22) PCT Filed: Oct. 18, 2006

(86) PCT No.: PCT/JP2006/321187
§ 371 (c)(1),
(2), (4) Date: May 29, 2007

(87) PCT Pub. No.: WO2007/046528
PCT Pub. Date: Apr. 26, 2007

(65) Prior Publication Data
US 2008/0099941 A1    May 1, 2008

(30) Foreign Application Priority Data

Oct. 18, 2005    (JP) ................................. 302679/2005
Aug. 28, 2006    (JP) ................................. 230222/2006

(51) Int. Cl.
*G01B 11/14*    (2006.01)
*G03F 7/00*    (2006.01)
(52) U.S. Cl. .................... 425/174.4; 264/40.1
(58) Field of Classification Search ............... 264/40.1, 264/494; 425/174.4, 169, 150, 171; 250/559.29
See application file for complete search history.

(56) References Cited

U.S. PATENT DOCUMENTS

| 4,422,763 | A |   | 12/1983 | Kleinknecht |
|-----------|---|---|---------|-------------|
| 5,481,362 | A |   | 1/1996  | Van Den Brink et al. |
| 5,515,167 | A | * | 5/1996  | Ledger et al. ................ 356/505 |
| 5,751,427 | A |   | 5/1998  | De Groot |

(Continued)

FOREIGN PATENT DOCUMENTS

KR    0415123 B1    12/2003

(Continued)

OTHER PUBLICATIONS

Stephan Y. Chou et al., "Imprint of Sub-25 nm Vias and Trenches in Polymers," 67(21) Appl. Phys. Lett., 3114-16 (1995).

*Primary Examiner* — Richard Crispino
*Assistant Examiner* — Daniel McNally
(74) *Attorney, Agent, or Firm* — Fitzpatrick, Cella, Harper & Scinto

(57) ABSTRACT

An imprint apparatus for imprinting a pattern provided to a mold onto a substrate or a member on the substrate includes a light source for irradiating a surface of the mold disposed opposite to the substrate and a surface of the substrate with light; an optical system for guiding the light from the light source to the surface of the mold and the surface of the substrate and guiding reflected lights from these surfaces to a spectroscope; a spectroscope for dispersing the reflected lights guided by the optical system into a spectrum; and an analyzer for analyzing a distance between the surface of the mold and the surface of the substrate. The analyzer calculates the distance between the surface of the mold and the surface of the substrate by measuring a distance between the surface of the mold and a surface formed at a position away from the surface of the mold.

7 Claims, 12 Drawing Sheets

U.S. PATENT DOCUMENTS

| | | |
|---|---|---|
| 5,923,033 A | 7/1999 | Takayama et al. |
| 6,128,085 A * | 10/2000 | Buermann et al. ............ 356/369 |
| 6,522,411 B1 | 2/2003 | Moon et al. |
| 6,541,287 B2 * | 4/2003 | Ino et al. .................... 438/16 |
| 6,696,220 B2 | 2/2004 | Bailey et al. |
| 7,303,703 B2 | 12/2007 | Hocheng et al. |
| 2003/0081971 A1 | 5/2003 | Nakayama |
| 2003/0210408 A1 * | 11/2003 | Jun et al. .................... 356/630 |
| 2004/0021254 A1 | 2/2004 | Sreenivasan et al. |
| 2004/0081798 A1 | 4/2004 | Lee et al. |
| 2004/0141163 A1 * | 7/2004 | Bailey et al. .................. 355/18 |
| 2004/0183236 A1 | 9/2004 | Ogino et al. |
| 2004/0191478 A1 | 9/2004 | Nishikawa et al. |
| 2004/0200411 A1 | 10/2004 | Willson et al. |
| 2005/0143483 A1 | 6/2005 | Sanuki et al. |
| 2007/0035056 A1 | 2/2007 | Suehira et al. |
| 2008/0000375 A1 | 1/2008 | Nielsen et al. |

FOREIGN PATENT DOCUMENTS

| | | |
|---|---|---|
| WO | 2006/016006 A1 | 2/2006 |

* cited by examiner (a)

(b)

(c)

(a)

(b)

(a)

(b)

(a)

(b)

IMPRINT APPARATUS, IMPRINT METHOD, AND MOLD FOR IMPRINT

TECHNICAL FIELD

The present invention relates to an imprint apparatus and imprint method which are used for imprinting a pattern provided to a mold onto a substrate or a member on the substrate and also relates to a mold for imprint.

BACKGROUND ART

In recent years, as proposed in Appl. Phys. Lett., Vol. 67, Issue 21, pp. 3114-3116 (1995) by Stephan Y. Chou et al., a technology for transferring a fine pattern provided on a mold onto a semiconductor, glass, resin, metal or the like has been developed and has received attention. This technology is called nanoimprint or nanoembossing since it has resolving power on the order of several nanometers. By utilizing this technology, it is possible to process a three-dimensional structure at a wafer level at the same time. For this reason, the technology has been expected to be applied to production technologies of optical devices such as photonic crystal, and production technologies of structures such as μ-TAS (Micro Total Analysis System) and biochips.

In a processing technology using such a nanoimprint, when it is used in a semiconductor fabrication technology etc., for example, a fine pattern on a mold is transferred onto a substrate or a member on the substrate in the following manner.

First, on the substrate (e.g., a semiconductor wafer), a layer of photocurable resin material is formed.

Then, the mold on which a desired pattern is formed is pressed against the resin layer, followed by irradiation with ultraviolet rays to cure the resin material. As a result, the pattern formed on the mold is transferred onto the resin layer.

Thereafter, etching is effected by using the resin layer as a mask, whereby the pattern of the mold is formed on the substrate.

During the transfer of the pattern formed on the mold in the imprint technology, in order to effect a high-resolution fine processing by improving transfer precision, it is necessary to measure a distance (gap) between the mold and the substrate.

U.S. Pat. No. 6,696,220 B2 has described a method of measuring the gap between the mold and the substrate by an interferometer. U.S. Pat. No. 6,696,220 B2 has also disclosed a gap measurement method capable of measuring the gap by appropriately designing a shape of the mold even when the gap (distance) is a distance of ¼ or less of a wavelength of light used for a measurement with the interferometer. The gap measurement method will be described with reference to FIG. 8.

In the case where a distance 706 between a first surface 702 of a mold 701 and a surface 704 of a substrate is ¼ or less of a measurement wavelength, it is difficult to accurately measure the distance 706 by an interferometer. In the gap measurement method described in U.S. Pat. No. 6,696,220 B2, a measuring area is provided at a position different from a position at which the first surface 702 is formed. In the measuring area, a second surface 703 is additionally provided. By such a constitution, when a distance between the second surface 703 and the substrate surface 704 is ¼ or more of the measurement wavelength, it is possible to measure the distance between the second surface 703 and the substrate surface 704. For this reason, by measuring a distance 705 between the first surface 702 and the second surface 703 in advance, a value of the distance 706 is capable of being measured even when the distance is ¼ or less of the measurement wavelength.

Incidentally, in these days of increased need for high-resolution fine processing, a further improvement in imprint accuracy of the above-described nanoimprint is required.

However, the gap measurement method disclosed in U.S. Pat. No. 6,696,220 B2 is not necessarily satisfactory for such a need.

More specifically, the distance 705 between the first surface 702 and the second surface 703 cannot be measured since these surfaces are not opposite to each other. Accordingly, the distance 705 and a distance between the second surface 703 and the substrate surface 704 are required to be measured by a method other than that using the interferometer. However, when these two distances are measured by the method other than that using the interferometer, there arises such a problem that a measurement error is liable to occur.

Further, U.S. Pat. No. 6,696,220 B2 has also described the need for an optical system different in constitution from an optical system for effecting measurement of the distance between the mold and the substrate in order to measure in-plane positions of the mold and the substrate. In the method described in U.S. Pat. No. 6,696,220 B2, in-plane alignment is effected based on data obtained by the in-plane position measurement. Incidentally, the term "in-plane" is used with respect to a plane parallel to a processing surface of the mold, and the in-plane positions are represented by X, Y, and θ. Further, the distance (gap) between the mold and the substrate is represented by Z.

An apparatus using nanoimprint is such a processing apparatus that a size ratio between the mold and an imprint pattern is 1:1, unlike an apparatus for reduction exposure such as a stepper or the like. For this reason, at a rearward position from a back surface of the mold, a spatial constraint condition is stringent compared with the case of the stepper or the like. For example, a pattern area at the processing surface of the mold is 26×36 mm and an objective lens used in the optical system has a diameter of approximately 20 mm, so that these dimensions are of the same order.

Accordingly, as described in U.S. Pat. No. 6,696,220 B2, when the optical system for effecting the distance measurement and the optical system for effecting the in-plane position measurement are separately provided, it is difficult to dispose these optical systems together in the same area. For this reason, there is a problem such that it is difficult to prevent an error in distance measurement caused by positional deviation between the mold and the substrate due to a temperature change, vibration, etc.

DISCLOSURE OF THE INVENTION

An object of the present invention is to solve the above-described problems.

A specific object of the present invention is to provide an imprint apparatus, an imprint method, and a mold for imprint which are capable of more accurately measuring a distance (gap) between a mold surface and a substrate surface.

According to an aspect of the present invention, there is provided an imprint apparatus for imprinting a pattern provided to a mold onto a substrate or a member on the substrate, the imprint apparatus comprising:

a light source for irradiating a surface of the mold disposed opposite to the substrate and a surface of the substrate with light;

an optical system for guiding the light from the light source to the surface of the mold and the surface of the substrate and guiding reflected lights from these surfaces to a spectroscope;

a spectroscope for dispersing the reflected lights guided by the optical system into a spectrum; and an analyzer for analyzing a distance between the surface of the mold and the surface of the substrate;

wherein the analyzer calculates the distance between the surface of the mold and the surface of the substrate by measuring a distance between the surface of the mold and a surface formed at a position away from the surface of the mold.

According to another aspect of the present invention, there is provided an imprint method for imprinting a pattern provided to a mold onto a substrate or a member on the substrate, the imprint method comprising:

a first measuring step of measuring a distance between a surface of the mold and a surface formed at a position away from the surface of the mold by an optical measurement method;

a second measuring step of measuring a distance between the surface formed at the position away from the surface of the mold and a surface of the substrate by the optical measurement method; and a calculating step of calculating a distance between the surface of the mold and the surface of the substrate by subtracting the distance measured in the first measuring step from the distance measured in the second measuring step.

According to a further aspect of the present invention, there is provided a mold for being used in an imprint apparatus including an optical measuring device, comprising:

a first member constituting a surface of the mold; and a second member different in refractive index from the first member;

wherein the first member has an optical thickness of ¼ or more of a wavelength of light used in optical measurement.

According to a still further aspect of the present invention, there is provided an imprint apparatus for imprinting a pattern provided to a mold onto a substrate or a member on the substrate, the imprint apparatus comprising:

a light source for irradiating a surface of the mold disposed opposite to the substrate and a surface of the substrate with light;

a first optical system for guiding the light from the light source to the surface of the mold and the surface of the substrate and guiding reflected lights from these surfaces to a spectroscope so as to measure a distance between the surface of the mold and the surface of the substrate; and a second optical system for guiding the light from the light source to the surface of the mold and the surface of the substrate and guiding reflected lights from these surfaces to an image pickup device so as to measure in-plane positions of the surface of the mold and the surface of the substrate;

wherein the first optical system and the second optical system shares a part of their optical axes.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2(a) to 2(c) are schematic views for illustrating a measurement principle when a broadband light source is used in Embodiment 1 of the present invention, wherein FIG. 2(a) shows a state in which there are three peaks and three valleys in a measuring wave number range, FIG. 2(b) shows a state in which there are two peaks and two valleys in the measuring wave number range, and FIG. 2(c) shows a state in which there are only one peak and only one valley in the measuring wave number range.

FIGS. 3(a) and 3(b) are schematic views for illustrating a measuring method using a back surface of a mold in Embodiment 1 of the present invention, wherein FIG. 3(a) shows a state in which a first surface of the mold and a surface of the resin material are located apart from each other, and FIG. 3(b) shows a state in which the first surface of the mold and the resin material surface contact each other.

FIGS. 4(a) to 4(c) are schematic views showing constitutions of molds used in the imprint apparatus in Embodiment 1 of the present invention, wherein FIG. 4(a) shows the case where a measuring area (406) ranges from a first surface of the mold to a first back surface of the mold, FIG. 4(b) shows the case where the measuring area ranges from the first surface of the mold to a second back surface of the mold, and FIG. 4(c) shows another example of the constitution of FIG. 4(b).

FIGS. 5(a) and 5(b) are schematic views showing constitutions of molds used in the imprint apparatus in Embodiment 2 of the present invention, wherein FIG. 5(a) shows the case where the mold is constituted by a first member and a second member, and FIG. 5(b) shows another embodiment of the mold shown in FIG. 5(a).

FIGS. 6(a) and 6(b) are schematic views for illustrating a gap measuring method using a mold including a first transparent member and a second transparent member in Embodiment 2 of the present invention, wherein FIG. 6(a) shows a state in which a first surface of the mold and a surface of a resin material are apart from each other, and FIG. 6(b) shows a state in which the first surface of the mold and the resin material surface contact each other.

FIGS. 7(a) and 7(b) are schematic views for illustrating a gap measuring method using different light sources before and after contact with a resin material in Embodiment 3 of the present invention, wherein FIG. 7(a) shows a state in which a first surface of a mold and a surface of a resin material are apart from each other, and FIG. 7(b) shows a state in which the first surface of the mold and the resin material surface contact each other.

FIGS. 9(a) to 9(d) are schematic views for illustrating a constitution of an optical system in Embodiment 4 of the present invention, wherein FIG. 9(a) shows a constitution in which an optical system for measuring an in-plane position and a part of an optical system for measuring a distance are coaxial with each other, FIG. 9(b) shows a constitution in which the optical system for measuring the distance includes a diaphragm, FIG. 9(c) shows a constitution in which the optical system for measuring the in-plane position includes a second image-forming optical system, and FIG. 9(d) shows a constitution in which the optical system for measuring the distance has a mechanism capable of being driven in a direction perpendicular to an optical axis.

FIGS. 10(a) and 10(b) are schematic views showing a condensing portion in Embodiment 4 of the present invention, wherein FIG. 10(a) shows a fiber and a holding portion, and FIG. 10(b) shows a member provided with a plurality of openings.

FIGS. 11(a) to 11(e) are schematic views showing a state of an alignment mark observed through an optical system in Embodiment 4 of the present invention, wherein FIG. 11(a) shows a constitution of a mark area including a distance measuring area at a center of a visual field and an in-plane position measuring area at another portion, FIG. 11(b) is a sectional view taken along AA' line shown in FIG. 11(a), FIG. 11(c) is a sectional view taken along AA' line shown in FIG. 11(a) and shows an embodiment different from that shown in FIG. 11(b), FIG. 11(d) shows a constitution of a mark area including an area in which distance measurement and a part of in-plane position measurement are effected, and FIG. 11(e) shows a constitution of marks for effecting three-dimensional position measurement.

FIGS. 12(a) and 12(b) are flowcharts showing a sequence of operations for effecting alignment in Embodiment 4 of the present invention, wherein FIG. 12(a) shows a sequence for effecting three axis-position control with a plurality of marks, and FIG. 12(b) shows a sequence for effecting three axis-position control with a single mark.

BEST MODE FOR CARRYING OUT THE INVENTION

Embodiment 1

In Embodiment 1, a constitutional example of an imprint apparatus according to the present invention will be described.

Figure 1:
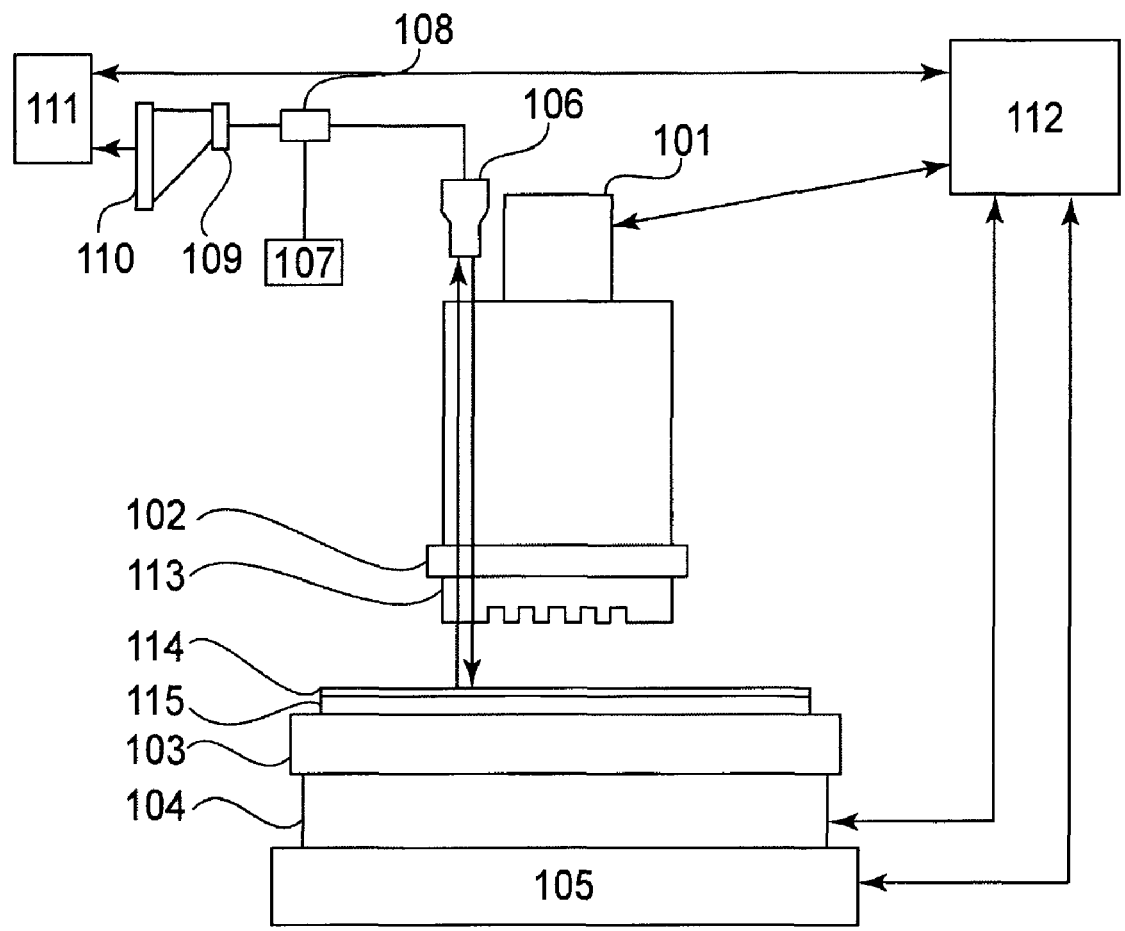
FIG. 1 is a schematic view showing a constitutional example of an imprint apparatus used in Embodiment 1 of the present invention.

FIG. 1 shows the constitutional example of the imprint apparatus in Embodiment 1.

Referring to FIG. 1, the imprint apparatus includes an exposure light source 101, a mold holding portion 102, a work holding portion 103, a work pressing mechanism 104, an in-plane moving mechanism 105, an optical system 106, a measurement light source 107, a beam splitter 108, a spectroscope 109, an image-pickup device 110, an analyzer 111, an imprint control mechanism 112, a mold 113, a photo-curable resin material 114, and a substrate 115.

The mold holding portion 102 effects chucking of the mold 113 by a vacuum chuck method or the like. A work or workpiece is movable to a desired position by the in-plane moving mechanism 105. The work pressing mechanism 104 is capable of adjusting a height of the work and applying pressure to the work.

Incidentally, a position of the work pressing mechanism 104 in a height direction can be monitored by an encoder. The encoder may desirably have accuracy of 100 nm or below. Control of the position movement, pressure application, and light exposure with respect to the work is effected by the imprint control mechanism 112.

Further, the imprint apparatus can also include a detection system for effecting in-plane alignment (not shown).

The substrate 115 is disposed at a position opposite to the mold 113, and the photo-curable resin material 114 is applied onto the substrate 115. Incidentally, a material for a member onto which a pattern of the mold is to be transferred is not limited to the photocurable resin material and may also be thermosetting resin materials, organic SOG (system on glass) materials, inorganic SOG materials, etc.

Next, a gap measuring mechanism in this embodiment will be described.

The gap measuring mechanism in this embodiment includes the optical system 106, the measurement light source 107, the beam splitter 108, the spectroscope 109, the image pickup device 110, and the analyzer 111.

The measurement light source 107 is constituted by a light source which emits broadband light of, e.g., 400 nm-800 nm.

The light emitted from the measurement light source 107 passes through the optical system 106 to reach the mold 113, the photo-curable resin material 114, and the substrate 115. The light interferes among the mold 113, the photocurable resin material 114, and the substrate 115. The interfering light is then returned to the optical system 106 to reach the spectroscope 109. The light dispersed by the spectroscope 109 is observed through the image pickup device 110 such as a line sensor.

The analyzer 111 includes a storing device for storing refractive index and measured data in advance and processes a signal from the image pickup device.

Here, by providing an additional beam splitter to the optical system, it is also possible to branch the optical system into an optical system for effecting a gap measurement and an optical system for effecting in-plane alignment (positional adjustment). As a result, the in-plane alignment and the gap measurement can be effected independently by fewer optical systems.

Next, a principle of measuring a film thickness and a gap distance will be described. First, a method of using a narrow band light source will be described.

As such a light source, there are a laser, an LED, etc. Further, it is also possible to use a broadband light source provided with a filter.

Here, where a thin film has a thickness of d and a refractive index of n, the case where light reflected at both end surfaces of the thin film is considered.

In the case where an intensity of light is decreased, a wave number $k_{mo}$ and a wavelength $\lambda_{mo}$ are represented by the following relationship using any integer m.

$$k_{mo} = \frac{1}{\lambda_{mo}} = \frac{2m+1}{4nd}$$

Further, in the case where the intensity of light is increased, a wave number $k_{me}$ and a wavelength $\lambda_{me}$ are represented by the following relationship using the integer m.

$$k_{me} = \frac{1}{\lambda_{me}} = \frac{m}{2nd}$$

As described above, the light intensity is periodically changed depending on the wave number and the wavelength, so that it is periodically changed for each distance corresponding to half of the wavelength. For example, when a measurement wavelength is 600 nm and the refractive index n is 1.5, a period of the change in light intensity is 200 nm.

In order to measure a distance smaller than this period, for example, an encoder having an accuracy of approximately 100 nm may be used. Further, when the sum of errors in initial position of a mold surface and a substrate surface is within 100 nm, it is possible to measure an absolute distance between the mold and the substrate.

Next, as in the case of the measurement light source 107 in this embodiment, a method of determining the thickness of the film and the absolute distance of the gap by using the broadband light source will be described. As the broadband light source, it is possible to use a halogen light source, a xenon light source, etc.

Figure 2:
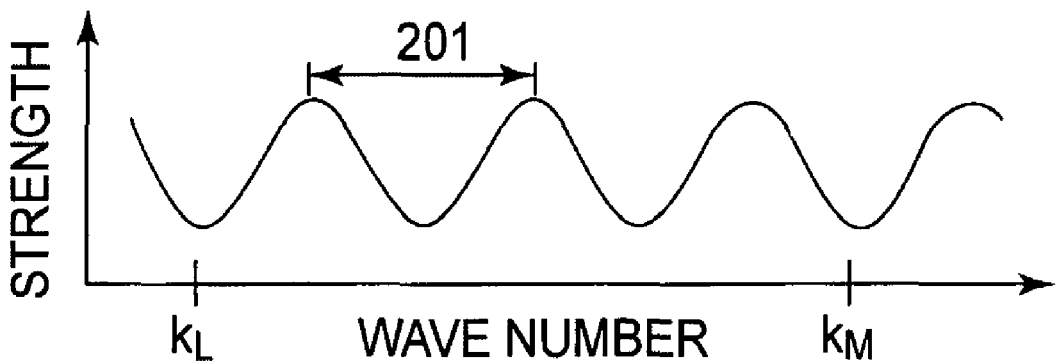
Figure 2:
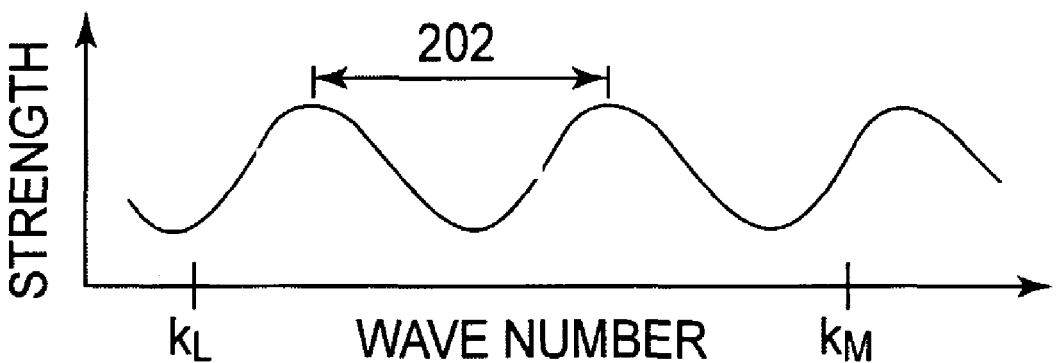
Figure 2:
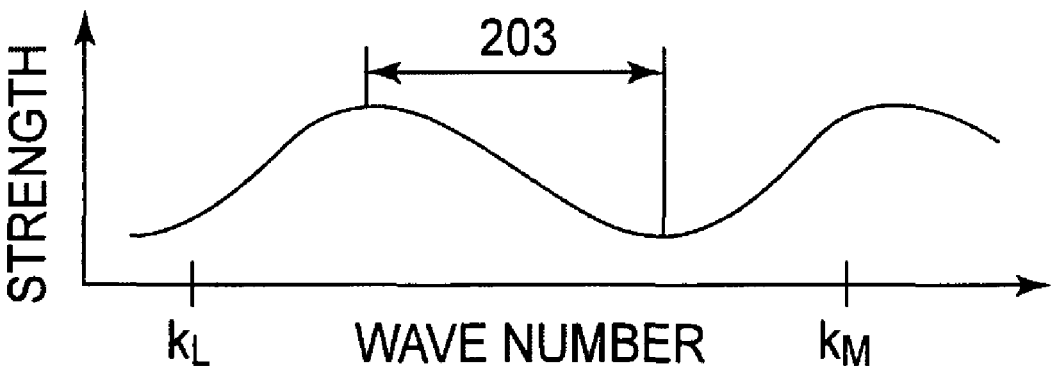

FIGS. 2(a) to 2(c) are schematic views showing relationships between the wave number and the light intensity when respective refractive indices and respective film thicknesses are different from each other.

FIG. 2(a) shows a state in which there are three peaks and three valleys in a measurement wave number (range). FIG. 2(b) shows a state in which there are two peaks and two valleys in the measurement wave number. FIG. 2(c) shows a state in which there are a single peak and a single valley in the measurement wave number.

The films in FIGS. 2(a) to 2(c) have refractive indices $n_a$, $n_b$ and $n_c$, respectively, and thicknesses $d_a$, $d_b$ and $d_c$, respectively. In FIGS. 2(a) and 2(b), reference numerals 201 and 202 represent distances between adjacent peaks and are $\frac{1}{2}n_a d_a$ and $\frac{1}{2}n_b d_b$, respectively. In FIG. 2(c), a reference numeral 203 represents a distance between adjacent peak and valley and is $\frac{1}{4}n_c d_c$. Based on these values, it is possible to calculate an optical length (distance) nd by a frequency analysis such as Fourier transform and peak detection with respect to peak and valley or peak and peak.

A minimum of a measurable wave number is taken as $k_L = 1/\lambda_L$ and a maximum of the measurable wave number is taken as $k_M = 1/\lambda_M$. Further, it is assumed that the refractive index does not depend on the wavelength for simplicity of explanation. An influence of multiple reflection such that light passed through an upper end is reflected at a lower end and then again reflected at the upper end and the lower end to be come out of the film is also not considered.

For instance, as a specific numerical example, the case where $d_a$=800 nm, $d_b$=500 nm, $d_c$=300 nm, n=1.4, $k_L$=1/400, and $k_M$=1/800 can be taken.

In the method in this embodiment, the numbers of the peaks and valleys are decreased as the thickness of the film is smaller, so that a measurable minimum thickness $d_{min}$ is obtained when m=0 and represented by the following formula.

$$d_{min} = \frac{1}{4nk_M} = \frac{\lambda_L}{4n}$$

When the values in the numerical example described above are applied in the formula, the measurable minimum thickness is 71 nm.

Next, when a film consisting of two layers is considered, light is reflected at respective end surfaces. For example, when the two layers have thicknesses $d_a$ and $d_b$, respectively, the sum of a spectrum of FIG. 2(a) multiplied by a constant and a spectrum of FIG. 2(b) multiplied by the constant is obtained by using light having a sufficiently broad band.

By effecting the frequency analysis using the sum of spectra, peaks are generated at three positions $n_a d_a$, $n_b d_b$, and $n_a d_a + n_b d_b$.

Further, in the case where the film is formed of three layers, by effecting the frequency analysis using the sum of spectra of FIGS. 2(a), 2(b) and 2(c), peaks appear at six positions $n_a d_a$, $n_b d_b$, $n_c d_c$, $n_a d_a + n_b d_b$, $n_b d_b + n_c d_c$, and $n_a d_a + n_b d_b + n_c d_c$.

Incidentally, in this embodiment, optical interferometry is used as the measuring method but it is also possible to use a method using ellipsometry. In the method using ellipsometry, changes in polarization state of incident light and reflected light are observed to obtain the film thickness, the distance between the mold and the substrate, etc.

Next, the gap measuring method in this embodiment will be described.

A condition of application to this method is that an optical length from the back surface of the mold to the front surface of the substrate is shorter than a coherence length of light. When the optical length is longer than the coherence length, lights reflected at the back surface of the mold and the front surface of the substrate do not interfere with each other, thus being unmeasurable.

Incidentally, a coherence length L can be represented by the following formula:

$$L = \frac{c}{\delta f} = \frac{\lambda_1 \lambda_2}{\lambda_1 - \lambda_2}$$

wherein c represents the speed of light and $\delta f$ represents a width of a frequency spectrum. Incidentally, the formula is modified by $c=f\lambda$. Further, $\lambda_1$ represents a maximum wavelength in spectrum and $\lambda_2$ represents a minimum wavelength in the spectrum.

For example, when $\lambda_1$ and $\lambda_2$ are nearly equal to 400 nm and $\lambda_1 - \lambda_2$=0.01 nm, the coherence length is 16 mm. In this case, when the mold has a thickness of 6 mm, the mold thickness is smaller than the coherence length, thus permitting the measurement of the gap (distance between the mold and the substrate).

Next, a relationship between positions of the mold and the substrate and interfering light (coherent light) will be described.

Figure 3:
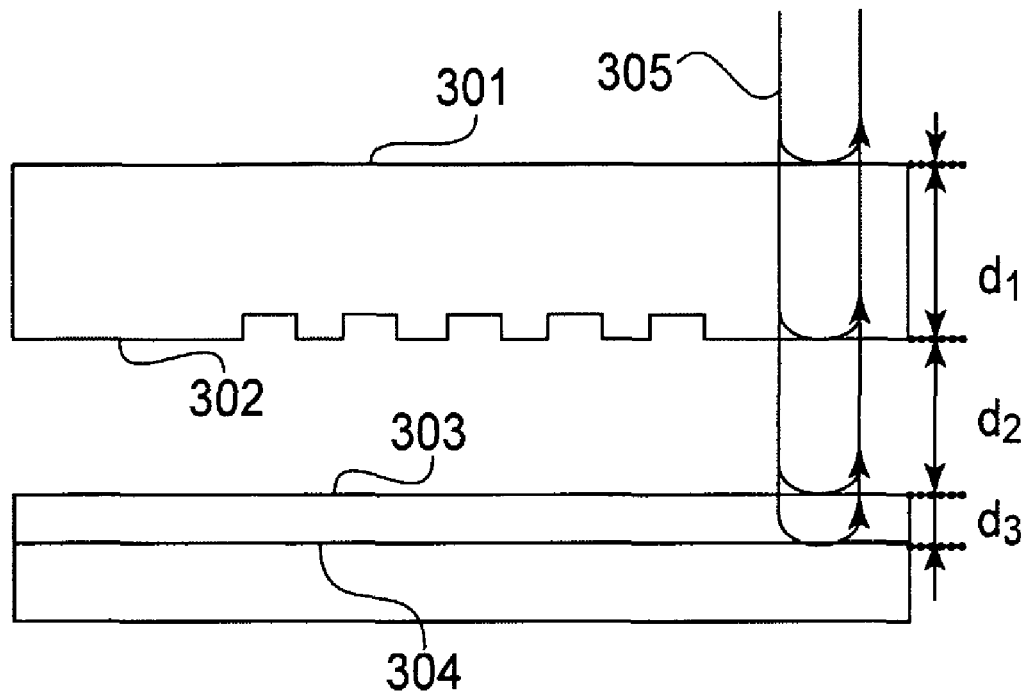
Figure 3:
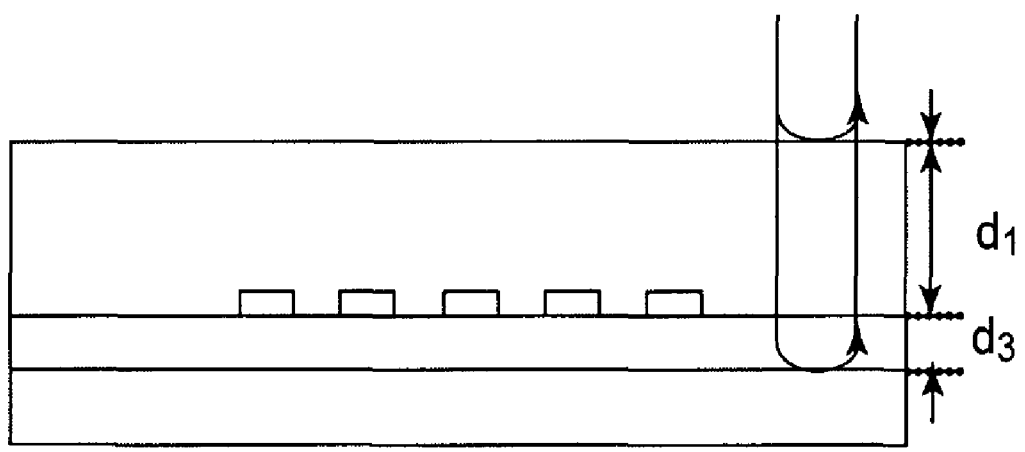

FIG. 3(a) is a schematic view showing a state in which the mold and the resin material do not contact each other. In this state, broadband light enters the mold and is reflected at a back surface 301 of the mold, a first surface 302 of the mold, a resin material surface 303, and a substrate surface 304. The respective reflected lights interfere with each other as indicated by a reference numeral 305 and is returned to a measuring system.

Here, a distance between the back surface of the mold and the first surface of the mold (where a pattern is formed) is taken as $d_1$, a distance between the first substrate of the mold and the resin material surface is taken as $d_2$, and a distance between the resin material surface and the substrate surface is taken as $d_3$.

In this case, when the interference light is dispersed and subjected to frequency analysis, peaks appear at six positions $n_1 d_1$, $n_2 d_2$, $n_3 d_3$, $n_1 d_1 + n_2 d_2$, $n_2 d_2 + n_3 d_3$, $n_1 d_1 + n_2 d_2 + n_3 d_3$, wherein $n_1$ represents a refractive index of the mold, $n_2$ represents a refractive index of air, and $n_3$ represents a refractive index of the photocurable resin material.

Assuming that these refractive indices are not changed during imprinting, it is possible to calculate the distances $d_1$, $d_2$, and $d_3$. Incidentally, these refractive indices may be stored in a memory of the imprint apparatus in advance and may appropriately be referenced.

FIG. 3(b) is a schematic view showing a state in which the mold and the resin material contact each other.

In this case, refractive indices of the mold and the resin material are close to each other, so that reflection at the surface where the pattern is formed is little caused to occur. For this reason, a peak appears at a position $n_1 d_1 + n_3 d_3$.

Next, a sequence of measuring the gap (between the mold and the substrate) while bringing the mold close to the substrate will be described.

First, at a position where the distance between the mold back surface and the substrate surface is the coherence length or more, the thickness of the mold is measured and stored. Then, the mold is brought near to the substrate by the wavelength pressing mechanism. Monitoring of the distance between the mold and the substrate is effected by an encoder of the wavelength pressing mechanism. When the mold is brought further near the substrate, the mold is placed in contact with the substrate. In this contact state, a peak appears at the position $n_1d_1+n_3d_3$.

By subtracting $n_1d_1$ which has been measured in advance from the value $n_1d_1+n_3d_3$, it is possible to calculate $d_3$. As a result, it is possible to determine the distance between the substrate surface and the surface where the pattern is formed.

By using the method described in this embodiment, an optical axis subjected to measurement of $n_1d_1$ in advance is identical to an optical axis subjected to measurement of distance during the approach of the mold to the substrate. For this reason, the distance between the pattern-formed substrate and the substrate surface can be determined with high accuracy.

When the distance between the pattern-formed substrate and the substrate surface can be controlled with high accuracy, it is also possible to control a thickness of a residual film layer, formed of the resin material on the substrate, with high accuracy. As a result, it is also possible to improve a precision of pattern transfer onto the substrate in a subsequent etching process.

Further, in the case where the value of the refractive index of a material constituting the mold surface is close to that of the refractive index of the resin material, when the mold and the resin material contact each other, it is difficult to obtain a reflection spectrum from a boundary surface therebetween. For this reason, in the conventional method wherein the mold back surface or the like is not subjected to a measurement, it is difficult to measure the distance between the pattern-formed surface and the substrate surface. In this embodiment, however, the back surface of the mold is subjected to a measurement, so that the distance between the mold surface and the substrate surface can be measured even in the case where the mold and the substrate contact each other.

The intensity spectrum of the light source is not flat. It is also preferable that the intensity spectrum be measured in advance and normalization be effected by performing a division between the spectrum of measurement light and the intensity spectrum. As a result, it is possible to effect frequency analysis with even higher accuracy.

Further, it is also preferable that the gap measuring mechanism be provided at three or more portions. As a result, an inclination between the mold and the substrate can be detected, so that it is also possible to adjust parallelism between the mold and the substrate.

As another method for adjusting the parallelism between the mold and the substrate, it is also preferable that a driving mechanism drive the optical system in an in-plane direction. As a result, it is possible to measure the gap while moving the measurement light in the in-plane direction. For example by measuring the gap at an origin point, a point moved in the X-direction, and a point moved in the Y-direction, the inclination between the mold and the substrate can be detected. As a result, it is possible to adjust the parallelism.

Figure 4:
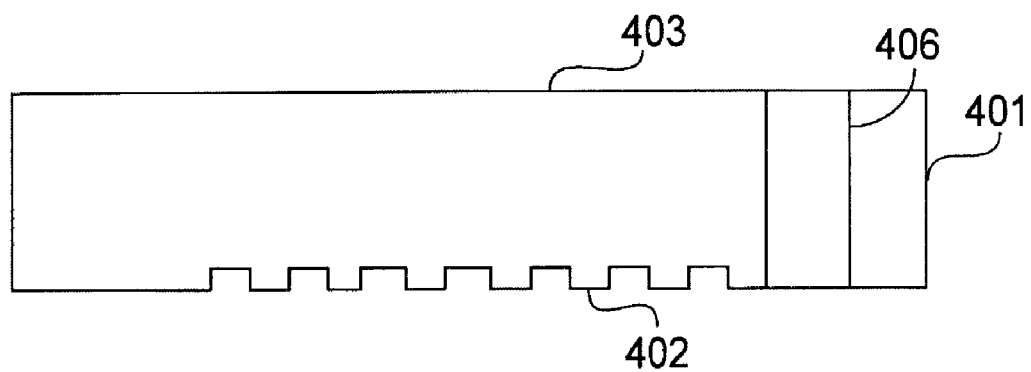
Figure 4:
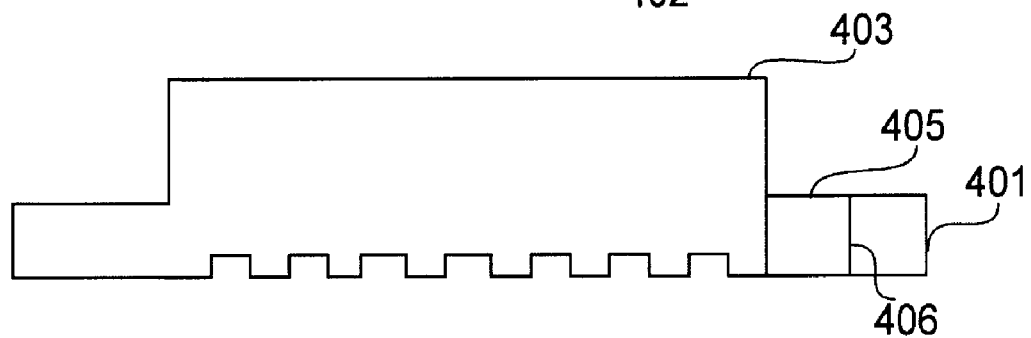
Figure 4:
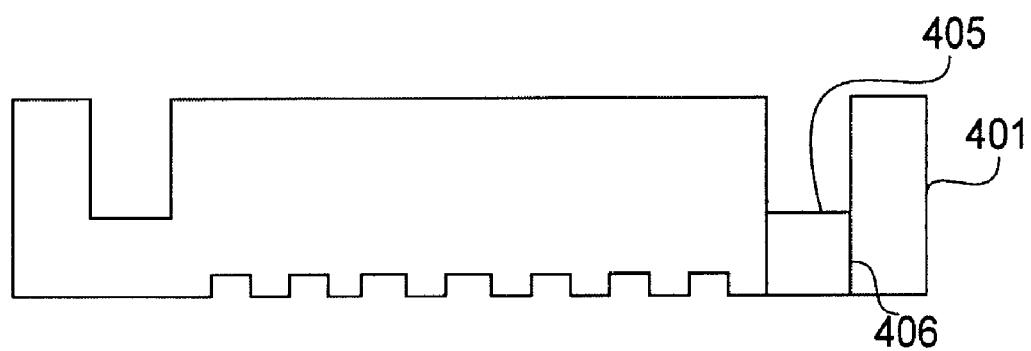

Constitutions of the mold in this embodiment are shown in FIGS. 4(a) to 4(c). In these figures, a first member 401 constitutes a body of the mold and is formed of a transparent material such as quartz glass (n: nearly equal to 1.5) or sapphire (n: nearly equal to 1.8).

FIGS. 4(a) shows a mold constitution using a mold front surface 402 and a mold back surface 403 as a measurement surface. A rectangular area 406 is a measurement area subjected to a measurement.

FIG. 4(b) shows a mold constitution using, as a measurement surface, a surface 405 located between the mold front surface 402 and the mold back surface 403 in place of the mold back surface 403. Similarly as in FIG. 4(a), a rectangular area 406 is the measurement area subjected to a measurement. This constitution is effective in the case where the distance between the pattern-formed surface 402 and the mold back surface 403 is longer than the coherence length. In this case, however, a distance between the pattern-formed surface 402 and the surface 405 is required to be shorter than the coherence length.

FIG. 4(c) shows another embodiment of FIG. 4(b) a rectangular measurement area 406 is located at a recessed portion.

Incidentally, the mold front surface, the mold back surface 403, and the surface 405 may desirably be a flat surface.

Embodiment 2

In Embodiment 2, a mold using a boundary surface between two members as the measurement surface and a measuring method using the mold will be described. This embodiment is useful in that it is applicable to even the case where the coherence length is shorter than the mold thickness.

Figure 5:
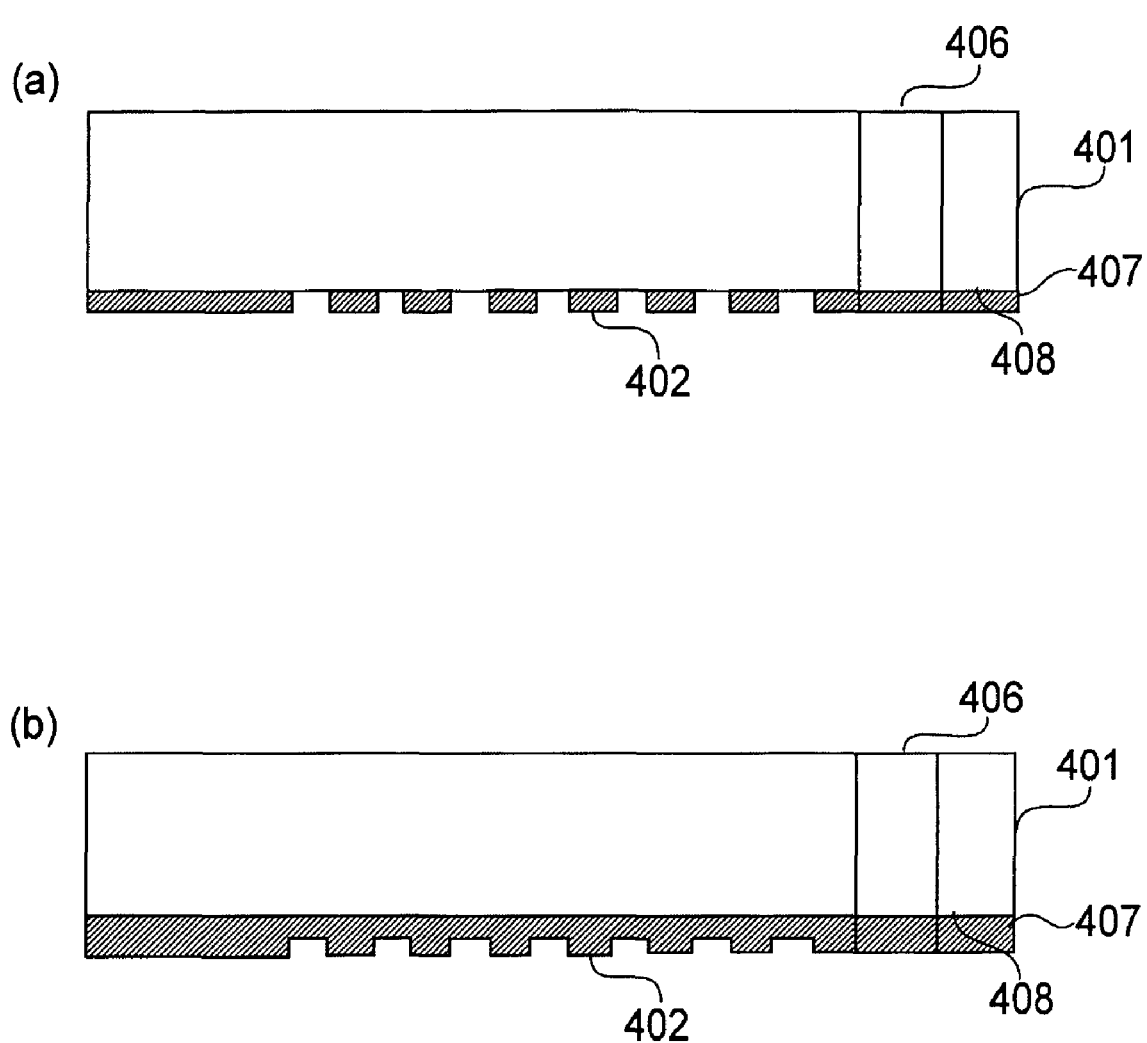

FIG. 5(a) shows a mold constitution using, as the measurement surface, the boundary surface between two members. This mold is constituted by a first member 401 and a second mold 407. The boundary surface between these first and second member 401 and 407 is indicated by a reference numeral 408. Further, the first member 401, the second member 407, and a photocurable resin material are constituted by materials different in refractive index.

As a material for the second member 407, it is possible to use titanium oxide (n: nearly equal to 2.4), ITO (n: nearly equal to 2), silicon nitride (n: nearly equal to 2), etc. Further, the thickness of the second member 407 may desirably be ¼ or more of a measurement wavelength in terms of the optical length.

FIG. 5(b) shows another embodiment of FIG. 5(a). In this embodiment, not only a projection, but also a portion adjacent to the projection, is formed of the second member 407.

Incidentally, the boundary surface between the first member 401 and the second member 407 may desirably be a flat surface.

Next, a method of measuring the gap (between the mold and the substrate) using the mold of this embodiment will be described. A portion in common with Embodiment 1 will be omitted from the explanation.

Figure 6:
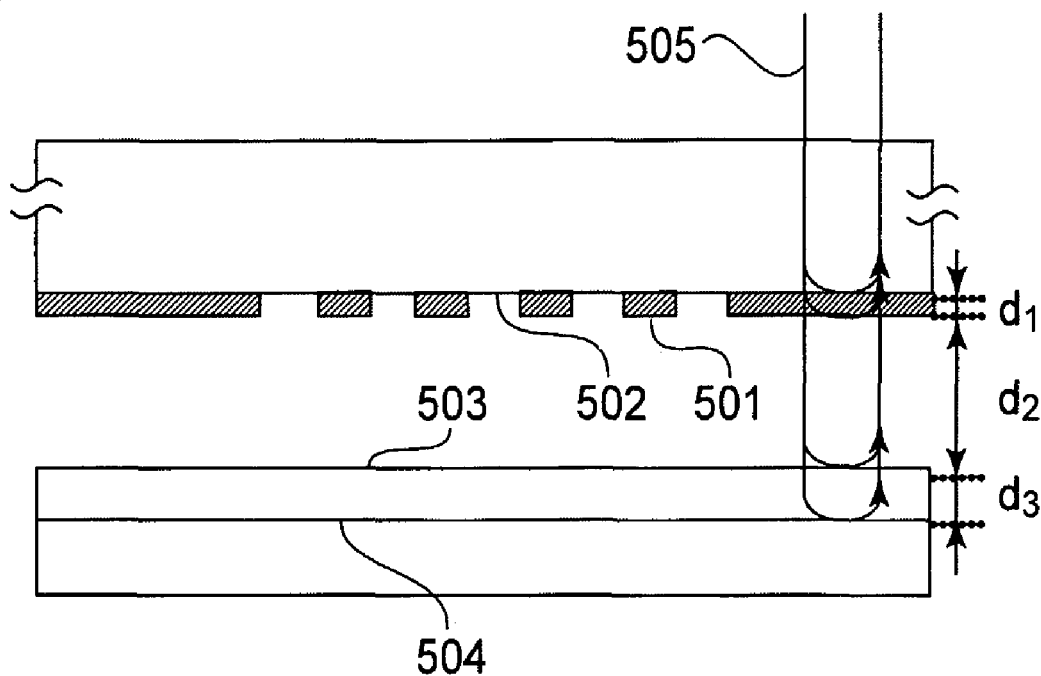
Figure 6:
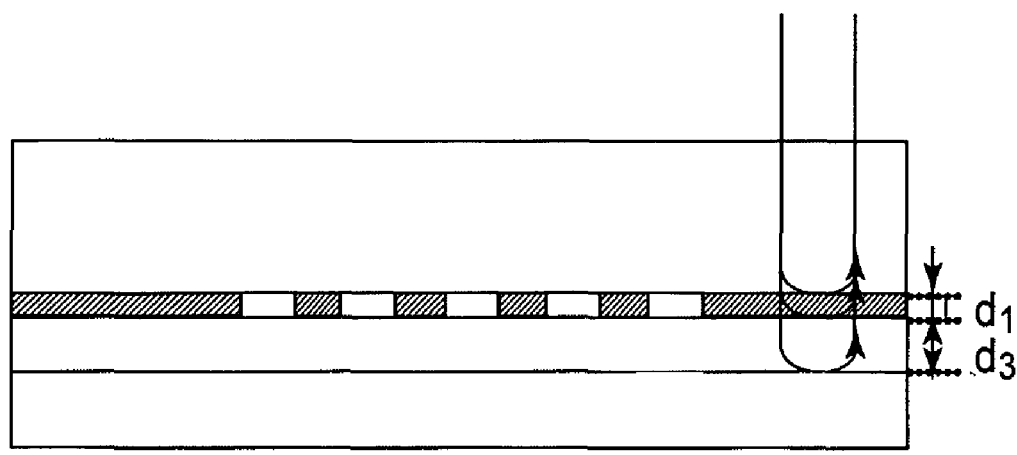

FIG. 6(a) shows a state in which the mold and the resin material do not contact each other. Surfaces shown in FIG. 6(a) include a mold surface 501, a boundary surface 502 between the first member and the second member, a resin material surface 503, and a substrate surface 504. Broadband light entering the mold is reflected at the boundary surface 502, the resin material surface 503, and the substrate surface 504 and respective reflected lights interfere with each other and return to the measuring system.

Here, the distance between the mold surface 501 and the boundary surface 502 is taken as $d_1$, the distance between the mold surface 501 and the resin material surface 503 is taken as $d_2$, and the distance between the resin material surface 503 and the substrate surface is taken as $d_3$.

When the interfering light is dispersed and subjected to frequency analysis, peaks appear at six positions $n_1d_1$, $n_2d_2$, $n_3d_3$, $n_1d_1+n_2d_2$, $n_2d_2+n_3d_3$, and $n_1d_1+n_2d_2+n_3d_3$. By referring to the refractive index from these peaks, it is possible to calculate $d_1$, $d_2$, and $d_3$. In this case, the distance between the pattern-formed surface and the substrate surface is $d_2+d_3$.

FIG. 6(b) shows a state in which the mold and the resin material contact each other. In the case where the mold and the resin material are different in refractive index, reflection also occurs at a boundary surface between the mold surface and the substrate surface. Accordingly, a peak appears at a position $n_1d_1+n_3d_3$. From this value, by subtracting the preliminarily measured $n_1d_1$, it is possible to calculate $d_3$. As a result, it is possible to determine the distance between the pattern-formed surface and the substrate surface.

Embodiment 3

In Embodiment 1, the mold thickness is measured by utilizing the mold back surface as the measurement surface, in the case where the coherence length of broadband light is longer than the mold thickness, to calculate the distance between the mold surface and the substrate surface.

Further, in Embodiment 2, the distance between the mold surface and the substrate surface can be calculated by using the boundary surface between the two members as the measurement surface even in the case where the coherence length of broadband light is shorter than the mold thickness.

In these embodiments, however, in the case where the coherence length of broadband light is shorter than the mold thickness and the second member cannot be provided to the mold, there is such a problem that the distance between the mold surface and the substrate surface cannot be measured.

In Embodiment 3, a measuring method that solves such a problem will be described.

Figure 7:
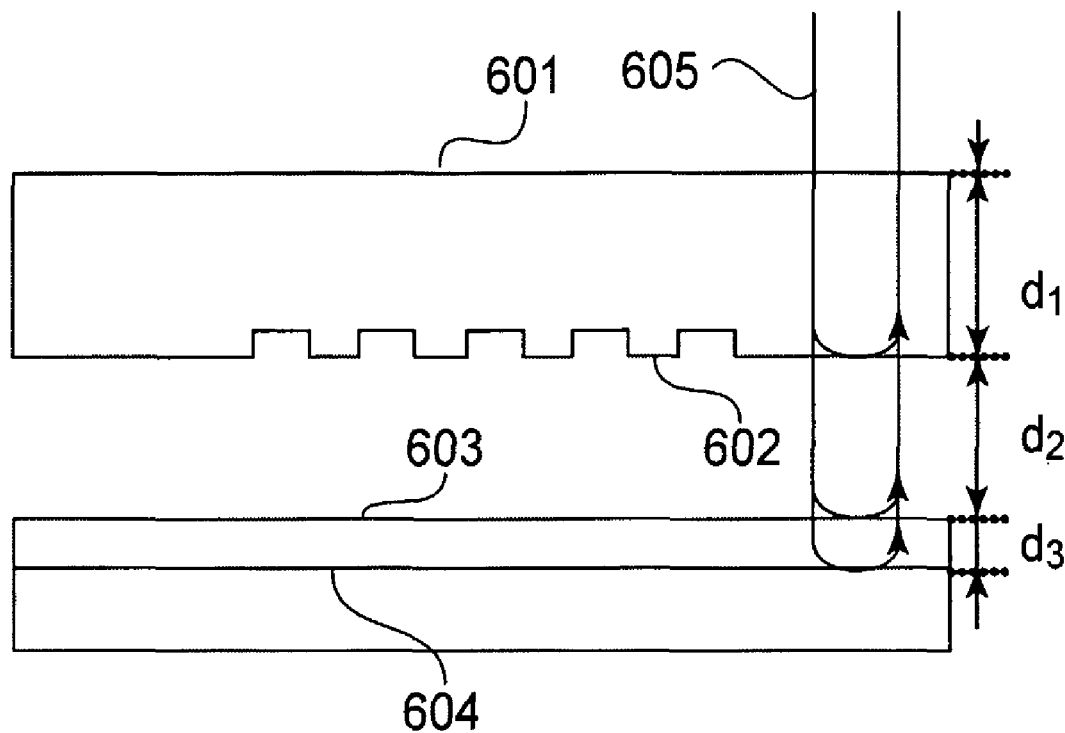
Figure 7:
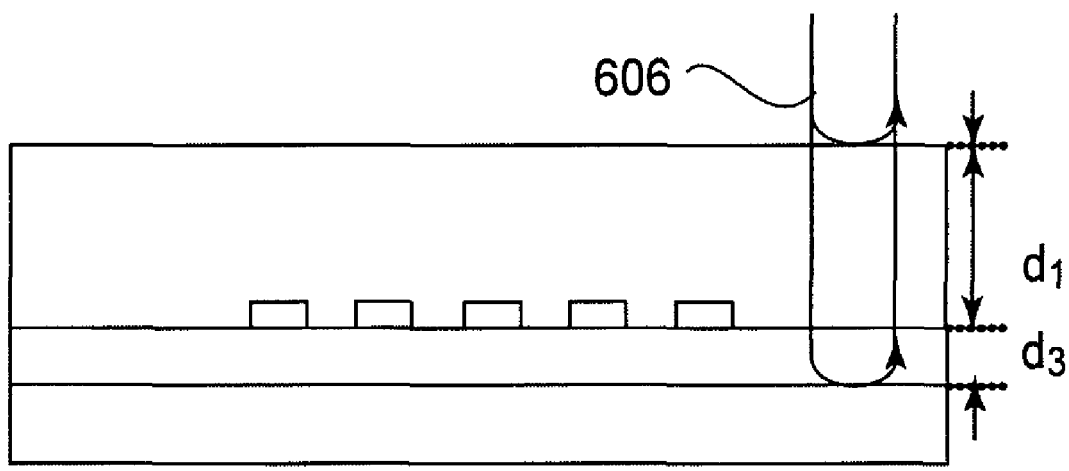
Figure 8:
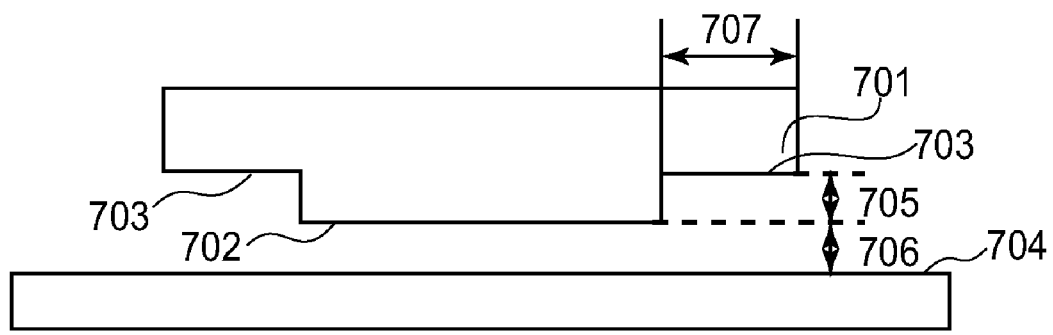
FIG. 8 is a schematic view showing a conventional embodiment described in U.S. Pat. No. 6,696,220.

FIG. 7(a) is a schematic view showing a noncontact state of the mold with the resin material. The broadband light entering the mold is reflected at a mold back surface 601, a mold front surface 602, a resin material surface 603, and a substrate surface 604. Respective reflected lights interfere with each other as indicated by a reference numeral 605 and are returned to the measuring system.

When the interfering light is dispersed and subjected to frequency analysis, peaks appear at three positions $n_2d_2$, $n_3d_3$, and $n_2d_2+n_3d_3$. In Embodiment 1, six peaks appear, whereas in Embodiment 3, only three peaks appear. This is because the mold thickness is larger than the coherence length of broadband light in Embodiment 3.

By making reference to refractive index data from these three peaks, it is possible to calculate the distances $d_2$ and $d_3$, respectively. In this embodiment, he distance between the mold surface and the substrate surface is $d_2+d_3$. The measuring method is performed until the mold contacts the substrate. The distance between the mold surface and the substrate surface when the mold and the substrate contact each other is taken as dc.

FIG. 7(b) is a schematic view showing a contact state of the mold with the resin material. In this state, the light entering the mold is changed from the broadband light to laser light. Compared with the broadband light, the laser light has a longer coherent length. For this reason, in the case where the distance between the mold back surface and the substrate surface is shorter than the coherence length of the laser light, the laser light is reflected at the mold back surface 601 and the substrate surface 604 and respective reflected lights interference with each other as indicated by a reference numeral 606.

As the mold approaches the substrate surface, an intensity of the interfering light is changed sinusoidally. More specifically, when a wavelength of the laser light is taken as $\lambda$, a period of the laser light is $\lambda/2n$. Accordingly, it is possible to measure a movement distance L by counting the intensity of frequency and the number of peaks of intensity. By effecting the measurement as described above, the distance between the mold surface and the substrate surface can be calculated by the formula: dc−L.

Incidentally, in the above description, the change from the broadband light to the laser light is effected during the contact of the mold surface with the resin material but may also be effected before the contact with the resin material.

The imprint method in this embodiment is characterized by a first measuring step of measuring the distance between the mold surface and the substrate surface by effecting irradiation with light of a first band, a second measuring step of measuring a movement distance of the mold by changing the irradiation light from the light of the first band to light of a second band narrower than the first band and effecting irradiation with the light of the second band, and a step of calculating the distance between the mold surface and the substrate surface by subtracting the distance measured in the second measuring step from the distance measured in the first measuring step.

Further, the imprint apparatus in this embodiment includes a first light source which is used for measuring the distance between the mold surface and the substrate surface and has a first band, a second light source having a second band narrower than the first band, an optical system for guiding the lights from the first light source and the second light source to the mold surface and the substrate surface and guiding the reflected lights to a spectroscope, the spectroscope for dispersing the light guided by the optical system, and an analyzer for analyzing the distance between the mold surface and the substrate surface. The analyzer is characterized in that the distance between the mold substrate and the substrate surface is calculated from the distance between the mold surface and the substrate surface obtained by effecting the irradiation using the first light source and the movement distance of the mold obtained by effecting the irradiation using the second light source.

Embodiment 4

In Embodiment 4, a constitutional embodiment in which a part of optical system for effecting distance measurement (Z) between the mold surface and the substrate surface and in-plane position measurement (XYθ) is coaxially disposed will be described.

Figure 9:
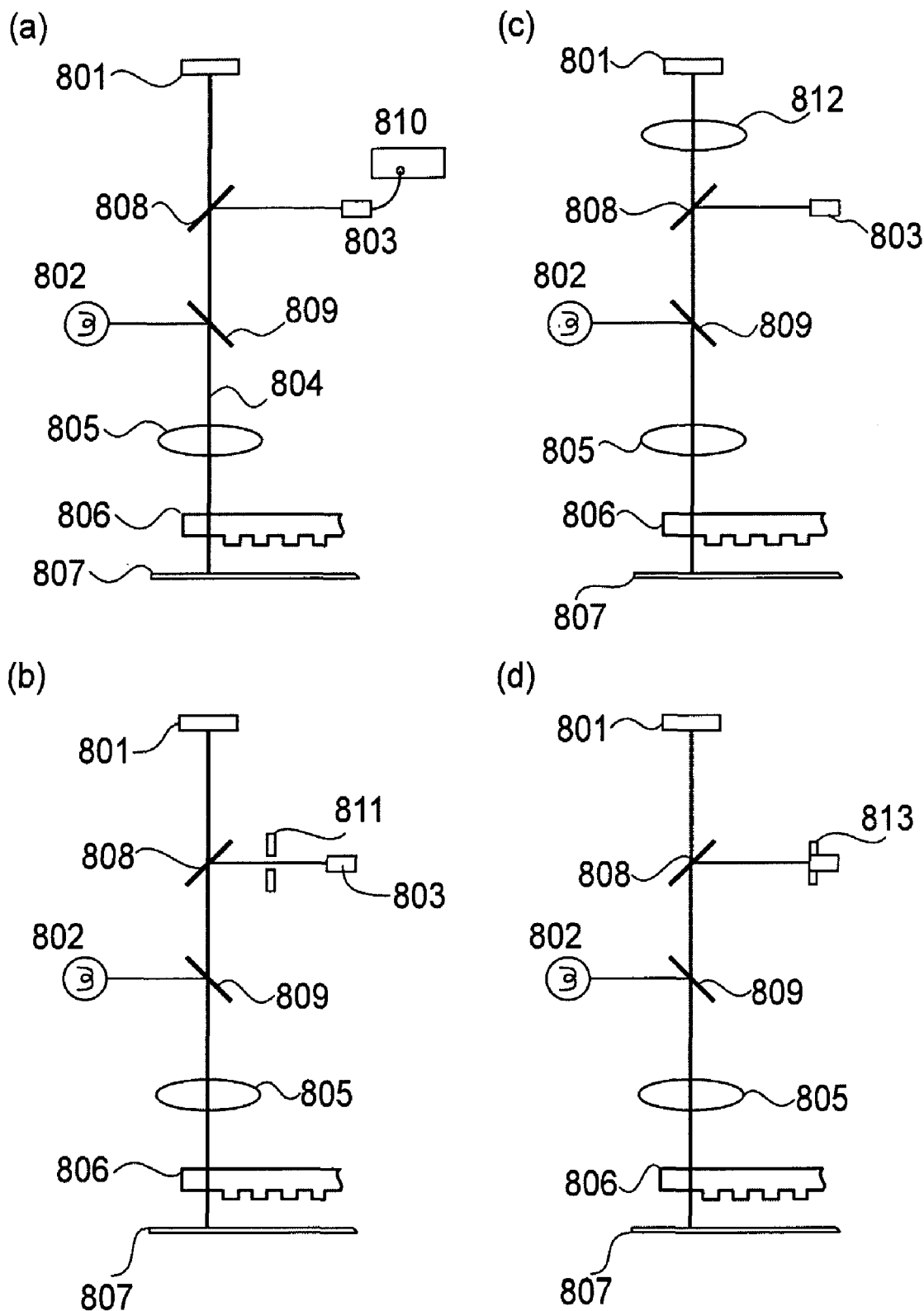

FIG. 9(a) shows the optical system in this embodiment. Light emitted from a light source 802 passes through a first beam splitter 809 and first imaging optics 805 to reach a mold 806 and a substrate 807. The light reflected by the mold and the substrate is returned to the first imaging optics 805. On the other hand, the light passing through the first beam splitter 809 to reach a second beam splitter 808 is branched off in directions toward a light-condensing portion 803 for distance measurement and an image-pickup device 801 for in-plane position measurement, respectively. The light having reached the light-condensing portion 803 reaches a spectroscope 810 through a waveguide such as fibers or the like.

The image-pickup device 801 and the light-condensing portion 803 are located at positions where information in the neighborhood of a focus of the first imaging optics 805 is formed into an image. Incidentally, an optical axis 804 from the substrate 807 to the second beam splitter 808 is shared by the distance measuring system and the in-plane position measuring system. Particularly, the nanoimprint is a method in which the mold and a processing pattern have a size ratio of 1:1. For this reason, there is a limiting factor such that it is difficult to sufficiently ensure a space behind the back surface of the mold. In other words, when the optical system for effecting the distance measurement and the optical system for effecting the in-plane position measurement are separately prepared, it is difficult not only to dispose these optical systems together behind the back surface of the mold, but also effect the distance measurement and the in-plane position measurement simultaneously. In such a state, it is difficult to prevent an error in the distance measurement by positional deviation between the mold and the substrate due to a temperature change, vibration, etc. On the other hand, in this embodiment, the optical system is shared, so that the above-described limiting factor can be obviated.

FIG. 9(b) shows a constitution for changing a numerical aperture (NA) of the distance measuring system and NA of the in-plane position measuring system. This constitution includes a diaphragm 811 disposed between the second beam splitter 808 and the light-condensing portion 803. In the in-plane position measurement, a larger NA provides a higher resolution and higher accuracy of position measurement. On the other hand, in the distance measurement, a smaller NA can be advantageous for removing an influence of aberration. In this case, the constitution of this embodiment is effective.

FIG. 9(c) shows a constitution for changing an optical magnification of the distance measuring system and an optical magnification of the in-plane position measuring system. Between the second beam splitter 808 and the image-pickup device 801, a second imaging optics 812 is disposed. In the in-plane position measurement, a higher magnification can permit position measurement with higher accuracy. On the other hand, it is preferable that the distance measuring system have a small NA and fewer optical systems to avoid an aberration. In this case, the constitution of this embodiment is effective.

FIG. 9(d) shows a constitution for effecting measurement of an inclination between the mold surface and the substrate surface. In the constitution of this embodiment, at an image forming position, a driving mechanism 813 for moving the light-condensing portion 803 in a planar direction perpendicular to the optical axis is disposed. By effecting the distance measurement while moving the light-condensing portion 803 in the planar direction, it is possible to detect the inclination between the mold surface and the substrate surface.

Figure 10:
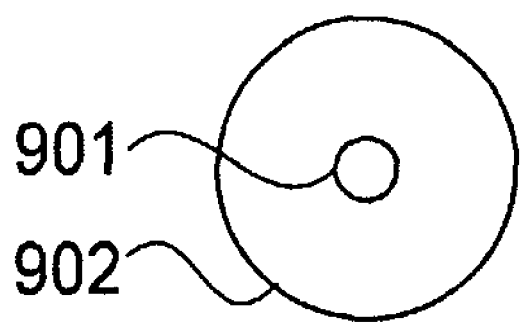
Figure 10:
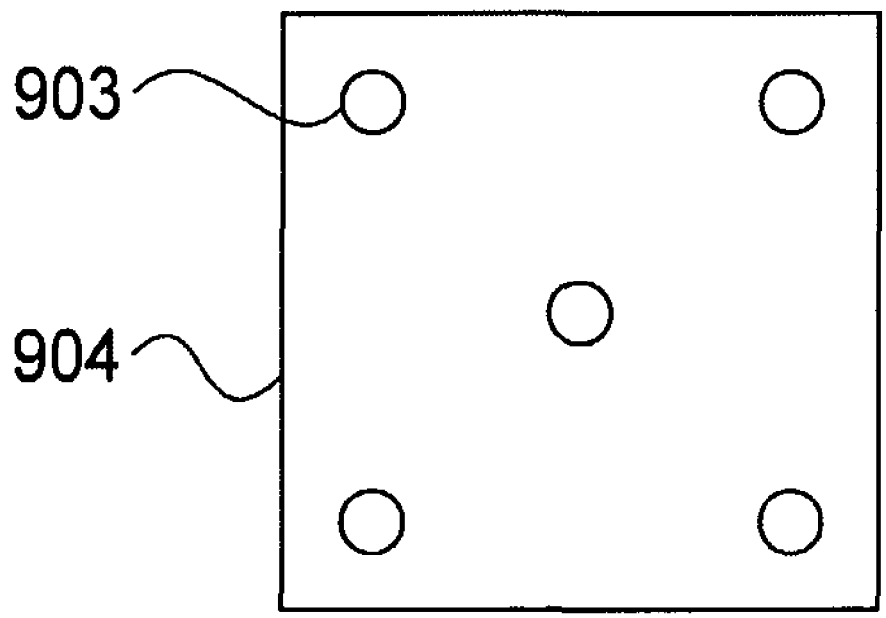

Here, a structure of the light-condensing portion 803 will be described with reference to FIGS. 10(a) and 10(b). In FIG. 10(a), the light-condensing portion 803 is constituted by a fiber 901 and a holding member 802. Around the holding member 902, a reflection prevention film for suppressing unnecessary reflection may also be provided. Further, a shape of the holding member 902 may also be a tapered shape so as not to return the light to the measuring portion.

FIG. 10(b) shows a member 904 provided with a plurality of openings 903. The member provided with the plurality of openings at an image surface is disposed between the light-condensing portion 803 and the second beam splitter 808 shown in FIG. 9(a). By providing a plurality of fibers at the openings and switching the openings, it is possible to measure distances at a plurality of in-plane positions. As a result, it is possible to calculate the inclination between the mold surface and the substrate surface.

Figure 11:
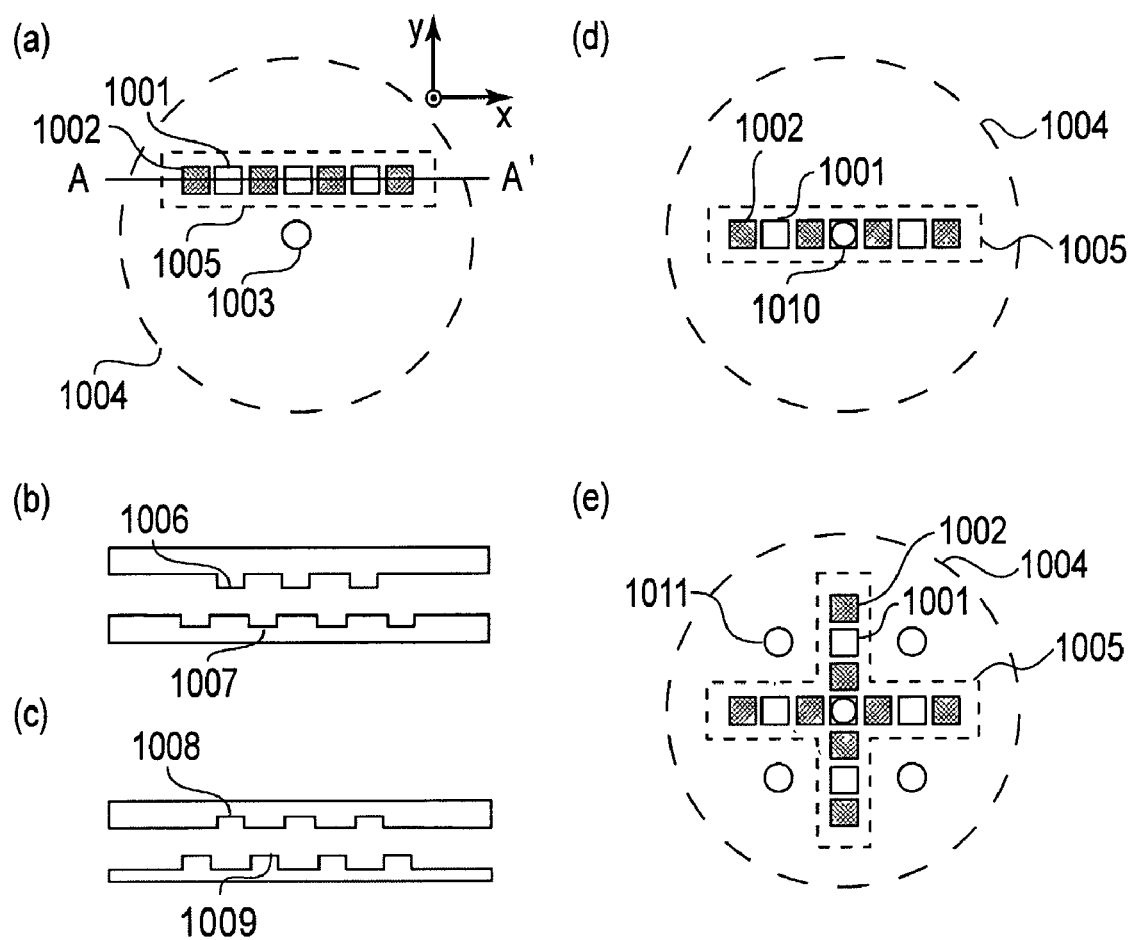

Next, with reference to FIGS. 11(a) to 11(e), a spatial position measurement mark area for simultaneously performing the distance measurement between the mold surface and the substrate surface and the in-plane position measurement will be described. In these figures, a positive direction of the z-axis is taken in a direction on the drawing from a back side to a front side as shown in FIG. 11(a). Further, a circular area 1004 indicated by a broken line is a field of view observed through the optical system.

FIG. 11(a) is a schematic view showing a state in which the mold and the substrate are located at substantially desired opposite positions. The spatial position measurement mark area is constituted by a first distance measurement area 1003 and an in-plane position measurement area 1005. The first distance measurement area 1003 corresponds to a central position of the field of view of the optical system. In the in-plane position measurement area 1005, a plurality of mold mark constituting elements 1001 and a plurality of substrate mark constituting elements 1002 are disposed. The plurality of mold mark constituting elements 1001 are arranged in the x-direction and the plurality of substrate mark constituting elements are arranged between adjacent mold mark constituting elements. Incidentally, when a spacing between a mold mark constituting element 1101 and an adjacent substrate mark constituting element is equal to an adjacent spacing, a determination that in-plane positions of the mold and the substrate are aligned is made. In the spatial position measurement mark area, it is possible to effect positional alignment along two axes in the in-plane direction (x-axis) at the mold surface and in the direction (z-axis) perpendicular to the in-plane direction.

FIG. 11(b) is a sectional view taken along the AA'-line shown in FIG. 11(a). A mold mark is constituted by a constitutional element 1006 having a projection structure and a substrate mark is constituted by a constitutional element 1007 having a recess structure. In the distance measurement area, the mold surface is at the same level as a top surface of projection structure of a mark and the substrate surface is at the same level as a top surface of projection structure of mark, so that a boundary area is not particularly provided.

FIG. 11(c) is another sectional view taken along AA'-line shown in FIG. 11(a), wherein the projection structure of the mold and the recess structure of the substrate are in reverse relationship with respect to the case of FIG. 11(b). Incidentally, both of these structures may be projection structures or recess structures.

Further, in the distance measurement area, both of or either one of the mold mark and the substrate mark may also have a recess structure.

FIG. 11(d) shows a constitution in which a second distance measurement area 1010 and a part of an in-plane position measurement area 1005 overlap each other.

FIG. 11(e) shows a constitution of marks capable of effecting three-dimensional in-plane position measurement. According to this constitution, the distance measurement can be effected at the center of field of view on three axes. Further, by effecting the distance measurement at a peripheral portion 1011, it is possible to measure an inclination between the mold surface and the substrate surface.

Next, a sequence for simultaneously effecting the distance measurement between the mold surface and the substrate surface and the in-plane position measurement will be described.

Figure 12:
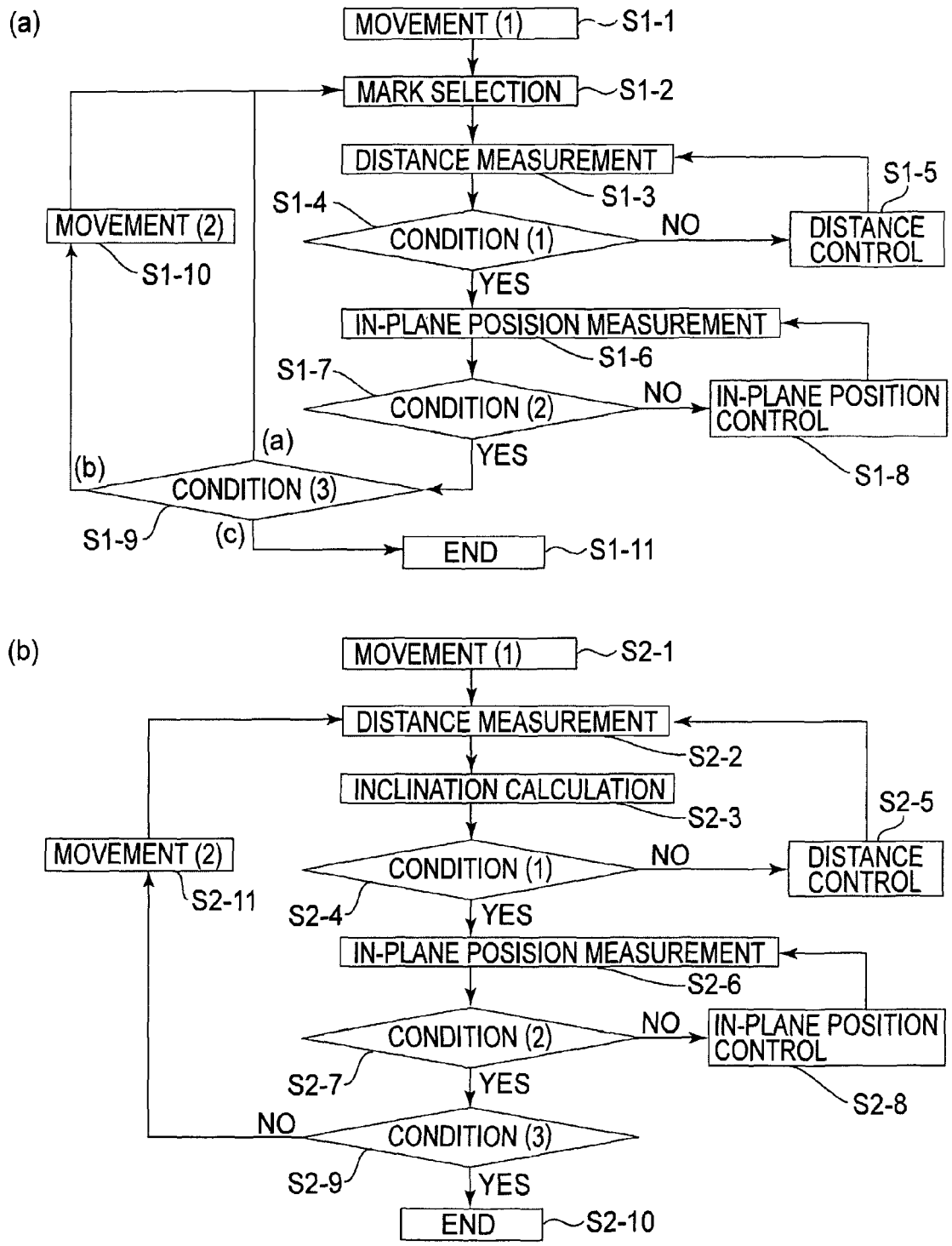

FIG. 12(a) is a flowchart showing a sequence of in-plane position control and distance control using the mark constitutions shown in FIGS. 11(a) and 11(d). In the case of effecting three-dimensional positional alignment, such a combination of the mark and the optical system is provided at two or more positions.

First, in step S1-1, the mold is brought near to the substrate. In this case, a distance between a mold processing surface and a substrate surface is set to, e.g., approximately several tens of micrometers by coarse adjustment using an encoder or the like of a motor. In step S1-2, a mark is selected. In step S1-3, distance measurement is effected and in step S1-4, determination as to whether condition (1) is satisfied or not is made.

The condition (1) is, e.g., such that an error in distance with respect to a desired distance is within several nanometers. When the condition (1) is not satisfied, distance control is effected in step S1-5. When the condition (1) is satisfied, in-plane position measurement is effected in step S1-6. In step S1-7, determination as to whether condition (2) is satisfied or not is made. The condition (2) is, e.g., such that an error in position is within several nanometers. When the condition (2) is not satisfied, in-plane position control is effected in step S1-8. When the condition (2) is satisfied, determination of condition (2) is made in step S1-9. The condition (3) includes, e.g., (a) all the marks are not measured (b) as a result of measurement of all the marks, it is necessary to further bring the mold near to the substrate, and (c) as a result of measurement of all the marks, the distance between the mold processing surface and the substrate reaches a final value. In the case of (a), the sequence goes to step S1-2 in which measurement of another mark is effected. In the case of (b), the sequence goes to step S1-10 in which the distance between the mold processing surface and the substrate surface is decreased by slight movement so that the decrease in distance is several tens of nm to several hundreds of nm. In the case of (c), the sequence is completed.

FIG. 12(b) is a flowchart showing a sequence in which three-dimensional positional alignment is effected by a single mark and a single optical system.

First, in step S2-1, similarly as in the case of FIG. 12(a), the mold is brought near to the substrate by movement (1). Next, in step S2-2, a distance therebetween is measured. This distance measurement is effected at a plurality of positions. In step S2-3, an inclination between the mold processing surface and the substrate surface is calculated. In step S2-4, determination of condition (1) such that errors in distance and inclination are within several nanometers is made. When the condition (1) is not satisfied, distance control is effected in step S2-5. When the condition (1) is satisfied, in-plane position measurement is effected in step S2-6. In step S2-7, determination of condition (2) such that an error in in-plane position is within several nanometers is made. When the condition (2) is not satisfied, in-plane position control is effected in step S2-8. When the condition (2) is satisfied, determination of condition (3) is made in step S2-9. The condition (3) is whether or not the distance between the mold processing surface and the substrate surface is a final distance. When the condition (3) is satisfied, the sequence is completed. When the condition (3) is not satisfied, the sequence goes to step S2-11 in which the distance between the mold processing surface and the substrate surface is decreased. Incidentally, even in the case of using a two-dimensional mark, it is possible to further improve accuracy by observing a plurality of marks through a plurality of optical systems.

INDUSTRIAL APPLICABILITY

According to the present invention, it is possible to provide an imprint apparatus, an imprint method, and a mold for imprint which are capable of more accurately measuring the distance between the mold surface and the substrate surface.

The invention claimed is:

1. An imprint apparatus for imprinting a pattern provided to a mold onto a substrate or a member on the substrate, the imprint apparatus comprising:
    a light source for irradiating a surface of the mold disposed opposite to the substrate and a surface of the substrate with light;
    a spectroscope;
    an optical system for guiding the light from the light source to the surface of the mold and the surface of the substrate and guiding light reflected from the surface of the mold and the surface of the substrate to the spectroscope, which disperses the reflected light guided by the optical system into a spectrum;
    an image sensor for observing the light dispersed by the spectroscope;
    an analyzer for analyzing a distance between the surface of the mold and the surface of the substrate based on information obtained by the image sensor,
    wherein the analyzer is adapted to analyze a first distance as a distance between the surface of the mold and a surface formed at a position away from the surface of the mold based on information obtained from the light emitted from the light source and reflected by the surface of the mold and the surface formed at the position away from the surface of the mold,
    wherein the analyzer is adapted to analyze a second distance as a distance between the surface formed at the position away from the surface of the mold and the surface of the substrate based on information obtained from the light emitted from the light source and reflected by the surface formed at the position away from the surface of the mold and the surface of the substrate, and
    wherein the analyzer is adapted to calculate the distance between the surface of the mold and the surface of the substrate by subtracting the first distance from the second distance.

2. The apparatus according to claim 1, wherein the surface formed at the position away from the surface of the mold is a back surface of the mold.

3. The apparatus according to claim 1, wherein the surface formed at the position away from the surface of the mold is provided between the surface of the mold and the back surface of the mold.

4. The apparatus according to claim 1, wherein the surface formed at the position away from the surface of the mold is an interface between a first member constituting the surface of the mold and a second member comprising a material different in refractive index from a material for the first member.

5. The apparatus according to claim 1, wherein the surface of the mold is at the same level as a surface at which the pattern is formed.

6. The apparatus according to claim 1, wherein the analyzer is adapted to analyze the first distance and the second distance with different timing.

7. The apparatus according to claim 1, wherein the analyzer is adapted to analyze the first distance in a state in which a resin material is not filled between the mold and the substrate and to analyze the second distance in a state in which the resin material is filled between the mold and the substrate.

* * * * *